(12) United States Patent
Bae et al.

(10) Patent No.: US 11,889,726 B2
(45) Date of Patent: Jan. 30, 2024

(54) DISPLAY DEVICE

(71) Applicant: SAMSUNG DISPLAY CO., LTD., Yongin-si (KR)

(72) Inventors: Han Sung Bae, Seongnam-si (KR); Se Ho Kim, Cheonan-si (KR); Sun Ja Kwon, Gunpo-si (KR); Dong Wook Kim, Anyang-si (KR); Jun Yong An, Anyang-si (KR); Sang Moo Choi, Yongin-si (KR); Jun Won Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 585 days.

(21) Appl. No.: 17/139,919

(22) Filed: Dec. 31, 2020

(65) Prior Publication Data

US 2021/0126084 A1 Apr. 29, 2021

Related U.S. Application Data

(63) Continuation of application No. 16/780,729, filed on Feb. 3, 2020, now Pat. No. 10,886,358, which is a
(Continued)

(30) Foreign Application Priority Data

Dec. 13, 2017 (KR) .......................... 10-2017-0171373

(51) Int. Cl.
*H01L 27/32* (2006.01)
*H10K 59/131* (2023.01)
(Continued)

(52) U.S. Cl.
CPC ......... *H10K 59/131* (2023.02); *G09G 3/3225* (2013.01); *G09G 3/3233* (2013.01);
(Continued)

(58) Field of Classification Search
CPC .. G09G 3/3266; G09G 3/3233; G09G 3/3225; H01L 27/1244; H10K 77/111; H10K 59/1213; H10K 59/131
See application file for complete search history.

(56) References Cited

U.S. PATENT DOCUMENTS

| 9,231,000 B2 | 1/2016 | Ko et al. |
| 9,311,855 B2 | 4/2016 | Jung et al. |

(Continued)

FOREIGN PATENT DOCUMENTS

| KR | 10-2011-0130925 A | 12/2011 |
| KR | 10-2013-0114997 A | 10/2013 |

(Continued)

*Primary Examiner* — Abbas I Abdulselam
(74) *Attorney, Agent, or Firm* — Lewis Roca Rothgerber Christie LLP

(57) ABSTRACT

A display device, includes: a display area including an upper side, a lower side, a left side, a right side, and inclined corner portions where the upper, lower, left, and right sides meet; a demultiplexing circuit unit adjacent to the lower side of the display area and the corner portion connected thereto; and a scan transmission line which extends toward the display area from an outer side of the left side and overlaps with the demultiplexing circuit unit outside the corner portion, wherein the demultiplexing circuit unit includes a demultiplexer transistor, and the scan transmission line is formed of a different conductive layer from an electrode of a demultiplexer transistor.

20 Claims, 12 Drawing Sheets

Related U.S. Application Data continuation of application No. 16/175,753, filed on Oct. 30, 2018, now Pat. No. 10,553,667.

(51) Int. Cl.
*G09G 3/3225* (2016.01)
*G09G 3/3233* (2016.01)
*H01L 27/12* (2006.01)
*H10K 59/121* (2023.01)
*H10K 77/10* (2023.01)
*G09G 3/3266* (2016.01)

(52) U.S. Cl.
CPC ..... H01L 27/1244 (2013.01); H10K 59/1213 (2023.02); H10K 77/111 (2023.02); *G09G 3/3266* (2013.01); *G09G 2300/0426* (2013.01); *G09G 2300/0809* (2013.01); *G09G 2310/0297* (2013.01); *H01L 27/1214* (2013.01)

(56) References Cited

U.S. PATENT DOCUMENTS

| | | | |
|---|---|---|---|
| 9,887,256 B2 | 2/2018 | Kim et al. | |
| 9,922,594 B2 | 3/2018 | Kwon | |
| 10,650,725 B2 | 5/2020 | Ka et al. | |
| 11,151,926 B2 | 10/2021 | Ka et al. | |
| 2009/0128545 A1 | 5/2009 | Lee et al. | |
| 2015/0170564 A1 | 6/2015 | Kwon | |
| 2015/0199936 A1 | 7/2015 | Watanabe et al. | |
| 2016/0203789 A1* | 7/2016 | Lee | G02F 1/133514 345/690 |
| 2016/0232837 A1 | 8/2016 | Lee | |
| 2017/0033173 A1 | 2/2017 | Kim | |
| 2017/0358641 A1 | 12/2017 | Park et al. | |
| 2017/0365808 A1 | 12/2017 | Lee et al. | |

FOREIGN PATENT DOCUMENTS

| | | |
|---|---|---|
| KR | 10-2014-0108023 A | 9/2014 |
| KR | 10-2015-0025774 A | 3/2015 |
| KR | 10-2015-0069433 A | 6/2015 |
| KR | 10-2016-0017695 A | 2/2016 |
| KR | 10-2016-0083605 A | 7/2016 |
| KR | 10-2016-0108639 A | 9/2016 |
| KR | 10-2017-0063281 A | 6/2017 |
| KR | 10-2017-0114028 A | 10/2017 |
| KR | 10-2017-0119270 A | 10/2017 |

* cited by examiner

DISPLAY DEVICE

CROSS-REFERENCE TO RELATED APPLICATIONS

This application is a continuation of U.S. patent application Ser. No. 16/780,729, filed Feb. 3, 2020, which is a continuation of U.S. patent application Ser. No. 16/175,753, filed Oct. 30, 2018, now U.S. Pat. No. 10,553,667, which claims priority to and the benefit of Korean Patent Application No. 10-2017-0171373, filed Dec. 13, 2017, the entire content of all of which is incorporated herein by reference.

BACKGROUND

Field

Aspects of some example embodiments of the present invention relate to a display device.

Description of the Related Art

The importance of a display device has increased with the development of multimedia. Accordingly, various types of display devices such as a liquid crystal display (LCD) and an organic light emitting display (OLED) have been used. Among them, the organic light emitting display, which is a self light emitting device, has attracted a considerable attention as a next generation display device because it has a relatively excellent viewing angle.

The organic light emitting display includes a pixel circuit and a driver driving the pixel circuit. The driver may include a scan driver providing a scan signal to the pixel circuit, a data driver providing a data signal to the pixel circuit, a demultiplexer, and the like. The scan driver and the demultiplexer may include driving circuits. These driving circuits may be displayed in a non-display area adjacent to a display area.

The non-display area becomes a kind of dead space due to a function of the display device. When the display area does not have a normal rectangular shape but an irregular shape, such as a corner rounded shape, or the like, the dead space may increase due to a layout of the driving circuits.

The above information disclosed in this Background section is only for enhancement of understanding of the background and therefore it may contain information that does not constitute prior art.

SUMMARY

Aspects of some example embodiments of the present invention include a display device which may reduce a dead space by an effective layout of driving circuits in a panel having an irregular shape.

According to some example embodiments of the present invention, a display device may include: a display area including pixels; and a non-display area as a non-display area disposed adjacent to the display area including a demultiplexing circuit unit and a scan transmission line which overlaps with the demultiplexing circuit unit, wherein the display area includes a pixel transistor gate electrode formed of a first conductive layer and a scan line connected to the pixel transistor gate electrode, a first electrode of a storage capacitor formed of a second conductive layer, a first electrode of a pixel transistor and a second electrode of the pixel transistor formed of a third conductive layer, a data line connected to the first electrode of the pixel transistor and a connection electrode connected to the second electrode of the pixel transistor, which are formed of a fourth conductive layer, and an anode electrode formed of a fifth conductive layer and connected to the connection electrode, wherein the demultiplexing circuit unit includes a demultiplexer transistor including a demultiplexer gate electrode and a data input electrode and a data output electrode opposed to each other with the demultiplexer gate electrode interposed therebetween, and wherein the scan transmission line is formed of a different conductive layer from the demultiplexer gate electrode, the data input electrode, and the data output electrode.

In an embodiment, the scan transmission line may be electrically connected with the scan line, and the data output electrode may be electrically connected with the data line.

In an embodiment, the scan transmission line may be formed of the fourth conductive layer.

In an embodiment, the demultiplexer gate electrode may be formed of the first conductive layer, and the data input electrode and the data output electrode may be formed of the third conductive layer.

In an embodiment, wherein the non-display area may further include a demultiplexer selection line connected to the demultiplexer gate electrode and formed of the second conductive layer, and a data transmission line connected to the data input electrode and formed of the first conductive layer.

In an embodiment, the scan transmission line may be formed of the fifth conductive layer.

In an embodiment, the display area may include a first side, a second side intersecting with the first side, and a corner portion where the first side and the second side meet and which has an interior angle larger than 90°.

In an embodiment, the corner portion of the display area may have a rounded curved shape, and the demultiplexing circuit unit includes the rounded curved shape corresponding to the corner portion.

In an embodiment, the display device may further comprise: a scan driver disposed adjacent to the first side and connected to the scan transmission line.

In an embodiment, the demultiplexing circuit unit may be disposed adjacent to the second side and the corner portion.

According to another embodiment of the invention, a display device may comprise: a display area including an upper side, a lower side, a left side, a right side, and inclined corner portions where the respective sides meet; a demultiplexing circuit unit disposed adjacent to the lower side of the display area and the corner portion connected thereto; and a scan transmission line which extends toward the display area from an outer side of the left side and overlaps with the demultiplexing circuit unit outside the corner portion, wherein the demultiplexing circuit unit includes a demultiplexer transistor, and the scan transmission line is formed of a different conductive layer from an electrode of a demultiplexer transistor.

In an embodiment, the demultiplexer transistor may include a demultiplexer gate electrode, and a data input electrode and a data output electrode opposed to each other with the demultiplexer gate electrode interposed therebetween.

In an embodiment, the display device may further comprise: a demultiplexer selection line connected to the demultiplexer gate electrode; a data transmission line connected to the data input electrode; and a data line connected to the data output electrode and disposed in the display area.

In an embodiment, the display device may further comprise: a scan line connected to the scan transmission line and disposed in the display area.

In an embodiment, the demultiplexer gate electrode, the scan line, and the data transmission line may be formed of a first conductive layer and the demultiplexer selection line may be formed of a second conductive layer, the data input electrode and the data output electrode may be formed of a third conductive layer, and the scan transmission line and the data line may be formed of a fourth conductive layer, and the first conductive layer, the second conductive layer, the third conductive layer, and the fourth conductive layer may be different layers divided by insulating layers, respectively.

In an embodiment, the demultiplexer gate electrode, the scan line, and the data transmission line may be formed of the first conductive layer and the demultiplexer selection line may be formed of the second conductive layer, the data input electrode and the data output electrode may be formed of the third conductive layer, the data line may be formed of the fourth conductive layer, and the scan transmission line may be formed of a fifth conductive layer, and the first conductive layer, the second conductive layer, the third conductive layer, the fourth conductive layer, and the fifth conductive layer may be different layers divided by the insulating layers, respectively.

In an embodiment, the data transmission line may extend in a direction which is substantially the same as an inclination direction of the inclined corner portion of the display area.

In an embodiment, the corner portion of the display area may have a step shape, and the demultiplexer selection line may extend with a shape corresponding to the step shape of the corner portion.

In an embodiment, the display device may further comprise: a scan driver disposed adjacent to the left side of the display area and connected to the scan transmission line, wherein the scan driver is separated from the corner portion by a predetermined interval, and the demultiplexing circuit unit is disposed within a separation space between the scan driver and the corner portion.

In an embodiment, the corner portion of the display area may have a rounded curved shape, and the demultiplexing circuit unit may include the rounded curved shape corresponding to the corner portion.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of some example embodiments of the present invention will become more apparent by describing in detail aspects of embodiments thereof with reference to the attached drawings, in which.

DETAILED DESCRIPTION

Figure 1:
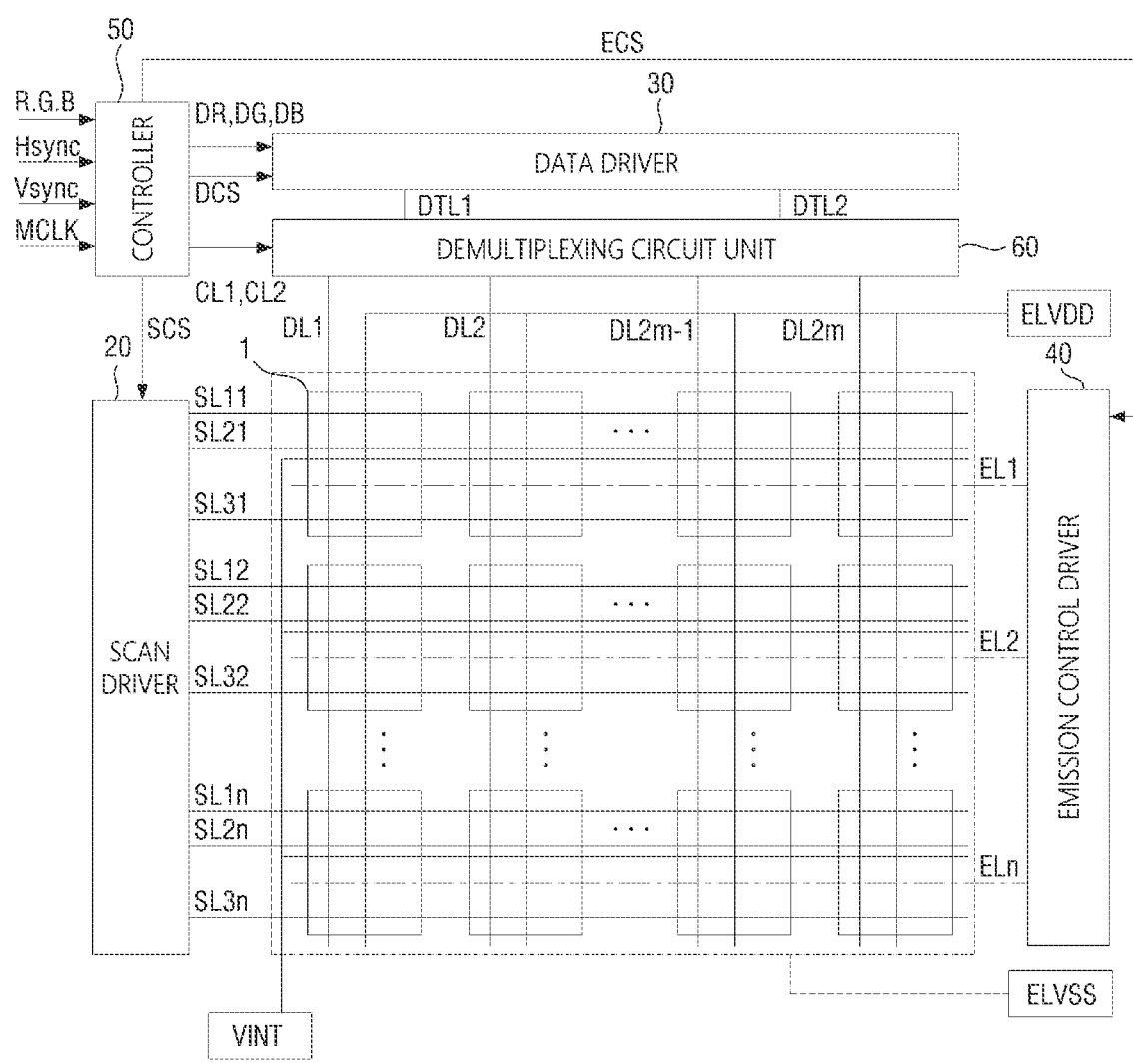
FIG. 1 is a schematic block diagram of an organic light emitting display according to some example embodiments.

Aspects of some example embodiments of the present invention relate to a display device. For example, some example embodiments include an organic light emitting display including a demultiplexer.

The terminology used herein is for the purpose of describing particular embodiments and is not intended to be limiting. As used herein, the singular forms, "a," "an," and "the" are intended to include the plural forms as well, unless the context clearly indicates otherwise. "Or" means "and/or." As used herein, the term "and/or" includes any and all combinations of one or more of the associated listed items. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Aspects of various example embodiments are described herein with reference to sectional illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, aspects of some example embodiments of the present invention will be described with reference to the attached drawings.

FIG. 1 is a schematic block diagram of an organic light emitting display according to some example embodiments.

Referring to FIG. 1, the organic light emitting display 70 includes a plurality of pixels 1, a scan driver 20, a data driver 30, a demultiplexing circuit unit 60, a emission control driver 40, and a controller 50.

The plurality of pixels 1 are positioned at intersections of a plurality of scan lines SL11 to SL1n, SL21 to SL2n, and SL31 to SL3n, a plurality of data lines DL1 to D2Lm, and a plurality of emission control lines EL1 to ELn, and arranged in a matrix form.

The plurality of scan lines SL11 to SL1n, SL21 to SL2n, and SL31 to SL3n and the plurality of emission control lines EL1 to ELn may extend in a row direction and the plurality of data lines DL1 to D2Lm may extend in a column direction. The row direction and the column direction may be switched to each other. Supply lines of initialization voltage VINT may be branched for each row and extended in the row direction and supply lines of first power voltage EVDDD may be branched for each column and extended in the column direction. However, embodiments of the present invention are not limited thereto, and extending directions of the supply line of the initialization voltage VINT and the first power voltage ELVDD may be variously modified.

Three scan lines SL11, SL21, and SL31, one data line DL1, one emission control line EL1, one initialization voltage (VINT) supply line, and one power voltage (ELVDD) supply line may pass in pixels in a first row and a first column, which are example pixels. Wirings may pass similarly as in other pixels.

The scan driver 20 generates and transfers three scan signals to each pixel 1 through the plurality of scan lines SL11 to SL1n, SL21 to SL2n, and SL31 to SL3n. That is, the scan driver 20 sequentially supplies scan signals to first scan lines SL11 to SL1n, second scan lines SL21 to SL2n, or third scan lines SL31 to SL3n.

The data driver 30 outputs data signals. The output data signals are transferred to the demultiplexing circuit unit 60 through data transmission lines (DTL) TL1 to TLm. The demultiplexing circuit unit 60 includes a plurality of demultiplexers (DEMUX). Each demultiplexer DEMUX divides the received data output signal and provides the divided data output signals to the plurality of data lines. For example, when the data output signals of the data driver 30 include a first data signal and a second data signal, the demultiplexer DEMUX may sequentially provide the first data signal to the first data line DL1 and the second data signal to the second data line DL2, respectively. The demultiplexer DEMUX will be described in detail with reference to FIG. 2.

Figure 2:
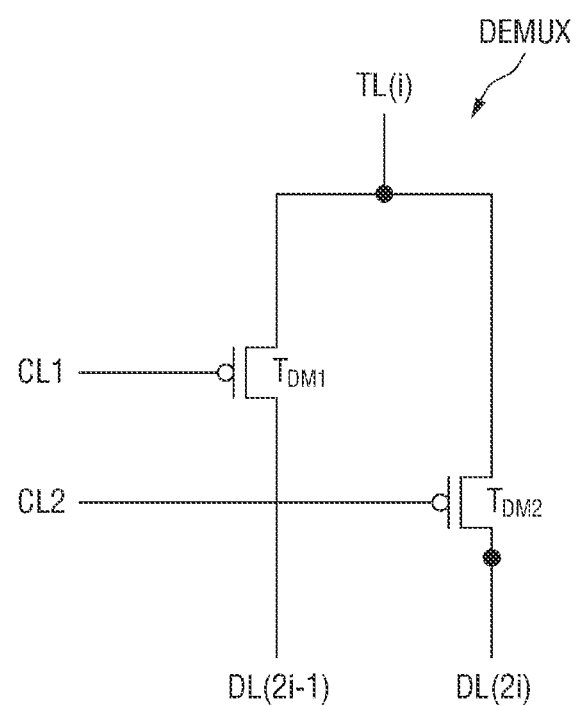
FIG. 2 is a circuit diagram of a demultiplexer included in a demultiplexing circuit unit of the organic light emitting display according to some example embodiments.

FIG. 2 is a circuit diagram of a demultiplexer included in a demultiplexing circuit unit of the organic light emitting display according to the embodiment.

Referring to FIG. 2, the demultiplexer DEMUX includes a first demultiplexer transistor TDM1 and a second demultiplexer transistor $T_{DM2}$. In the drawing, it is illustrated that the first demultiplexer transistor $T_{DM1}$ and the second demultiplexer transistor $T_{DM2}$ are both PMOS transistors, but the present invention is not limited thereto.

The first demultiplexer transistor $T_{DM1}$ is connected between the data transmission line (DTL) TL (i) and the first data line DL(2i-1) and includes a gate electrode connected to a first demultiplexer selection signal CL1. When the first demultiplexer selection signal CL1 of a low level is applied to the gate electrode, the first demultiplexer transistor $T_{DM1}$ is turned on and the data signal applied to the data transmission line (DTL) TLi may be thus output to the first data line DL(2i-1).

The second demultiplexer transistor $T_{DM2}$ is connected between the data transmission line (DTL) TL(i) and the first data line DL(2i) and includes the gate electrode connected to a second demultiplexer selection signal CL2. When the second demultiplexer selection signal CL2 of the low level is applied to the gate electrode, the second demultiplexer transistor $T_{DM2}$ is turned on and the data signal applied to the data transmission line (DTL) TLi may be thus output to the second data line DL(2i).

When the first demultiplexer transistor $T_{DM1}$ and the second demultiplexer transistor $T_{DM2}$ are selectively turned on by the first demultiplexer selection signal CL1 and the second demultiplexer selection signal CL2, the data signal of the data transmission line (DTL) TL(i) may be temporally divided and provided to the first data line DL(2i-1) and the second data line DL(2i).

Meanwhile, in some example embodiments, the demultiplexer DEMUX distributes one data signal received from the data driver 30 to two data lines, but it is apparent to those skilled in the art that the demultiplexer DEMUX may distribute one data signal to three or four or more data lines.

Referring back to FIG. 1, the data signals output by the demultiplexing circuit unit 60 transfer data signals to the respective pixels 1 through the plurality of data lines DL1 to DL2m. The data signal is supplied to the pixel 1 selected by a first scan signal every time the first scan signal is supplied to the first scan lines SL11 to SL1n.

The emission control driver 40 generates and transfers emission control signals to the respective pixels 1 through the plurality of emission control lines EL1 to ELn. The emission control signal controls an emission time of the pixel 1. The emission control driver 40 may be integrated into the scan driver 20 when the scan driver 20 generates the scan signal and the emission control signal. The emission control driver 40 may be omitted depending on an internal structure of the pixel 1.

The controller 50 converts a plurality of video signals R, G, and B transferred from the outside into a plurality of video data signals DR, DG, and DB and transfers the image data signals to the data driver 30. Further, the controller 50 receives a vertical synchronization signal Vsync, a horizontal synchronization signal Hsync, and a clock signal MCLK and generates control signals for controlling driving of the scan driver 20, the data driver 30, and the emission control driver 40 and transfer the generated control signals to the scan driver 20, the data driver 30, and the emission control driver 40, respectively. That is, the controller 50 generates and transfers a scan driving control signal SCS for controlling the scan driver 20, a data driving control signal DCS for controlling the data driver 30, and an emission driving control signal ECS for controlling the emission control driver 40, respectively. Further, the controller 50 generates the demultiplexer selection signals CL1 and CL2 for controlling the demultiplexers DEMUX and transfers the generated demultiplexer selection signals CL1 and CL2 to the demultiplexing circuit unit 60.

Each of the plurality of pixels 1 receives the first power voltage ELVDD and second power voltage ELVSS. The first power voltage ELVDD may be predetermined high level voltage and the second power voltage ELVSS may be voltage lower than the first power voltage ELVDD.

Each of the plurality of pixels 1 emits light of predetermined luminance by driving current Ioled supplied to a light emitting element according to the data signals transferred through the plurality of data lines DL1 to DL2m.

The first power voltage ELVDD, the second power voltage ELVSS, the initialization voltage VINT, and the like may be supplied from an external voltage source.

Figure 3:
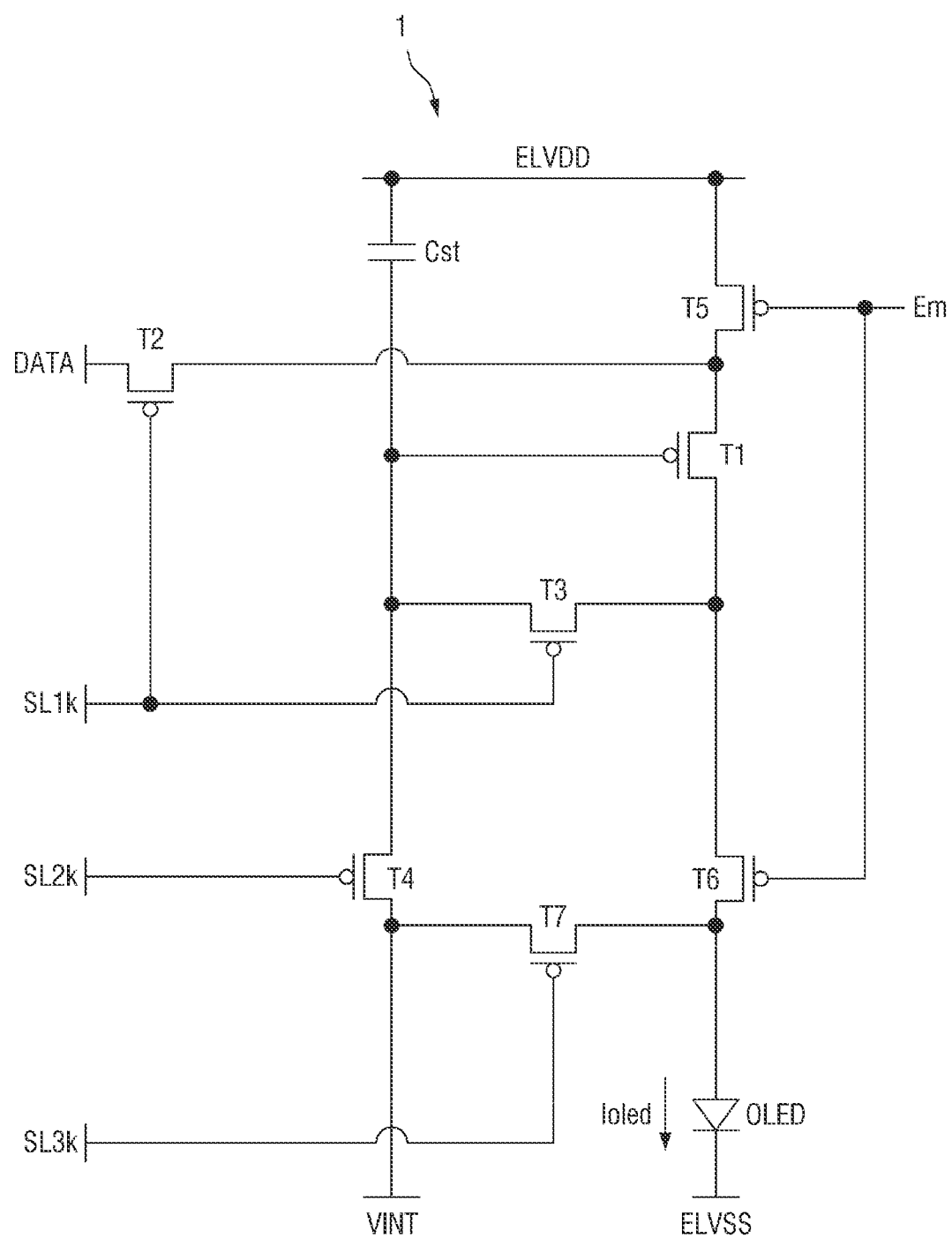
FIG. 3 is an equivalent circuit diagram of one pixel of the according to some example embodiments.

FIG. 3 is an equivalent circuit diagram of one pixel of the according to the embodiment.

Referring to FIG. 3, the circuit of one pixel 1 of the organic light emitting display may include an organic light emitting diode (OLED), a plurality of transistors T1 to T7, and a storage capacitor Cst. A data signal DATA, a first scan signal SL1$j$, a second scan signal SL2$j$, a third scan signal SL3$j$, an emission control signal EM, the first power voltage ELVDD, second power voltage ELVSS, and the initialization voltage VINT.

The organic light emitting diode OLED includes an anode electrode and a cathode electrode. The storage capacitor Cst includes a first electrode and a second electrode.

The plurality of transistors may include first to seventh transistors T1 to T7. Each of the transistors T1 to T7 includes the first electrode and the second electrode. Any one of the first electrode and the second electrode each of the transistors T1 to T7 is a source electrode and the other one is a drain electrode.

Each of the transistors T1 to T7 may be a thin film transistor. Each of the transistors T1 to T7 may be either a PMOS transistor or an NMOS transistor. Although all of the transistors T1 to T7 of the pixel are illustrated in the figures as being PMOS transistors, the transistors T1 to T7 may be configured by NMOS transistors or may be mixed. For example, a first transistor T1 as a driving transistor, a second transistor T2 as a data transfer transistor, a fifth transistor T5 as a first emission control transistor, and a sixth transistor T6 as a second emission control transistor are the PMOS transistors, while a third transistor T3 as a compensation transistor, a fourth transistor T4 as a first initialization transistor, and a seventh transistor T7 as a second initialization transistor may be the NMOS transistors.

The gate electrode of the first transistor T1 is connected to the first electrode of the storage capacitor Cst. The first electrode of the first transistor T1 is connected to a terminal of the first power voltage ELVDD via the fifth transistor T5. The second electrode of the first transistor T1 is connected to the anode electrode of the organic light emitting diode OLED via the sixth transistor T6. The first transistor T1 receives the data signal DATA according to a switching operation of the second transistor T2 and supplies driving current Id to the organic light emitting diode OLED.

The gate electrode of the second transistor T2 is connected to the terminal of the first scan signal SL1$j$. The first electrode of the second transistor T2 is connected to the terminal of the data signal DATA. The second electrode of the second transistor T2 is connected to the first terminal of the first transistor T1 and connected to the terminal of the first power voltage EVLDD via the fifth transistor T5. The second transistor T2 is turned on in response to the first scan signal SL1$j$ and performs the switching operation of transferring the data signal DATA to the first electrode of the first transistor T1.

The gate electrode of the third transistor T3 is connected to the terminal of the first scan signal SL1$j$. The first electrode of the third transistor T3 is connected to the second electrode of the first transistor T1 and connected to the anode electrode of the organic light emitting diode OLED via the sixth transistor T6. The second electrode of the third transistor T3 is connected to the first electrode of the storage capacitor Cst, the first electrode of the fourth transistor T4, and the gate electrode of the first transistor T1. The third transistor T3 is turned on according to the first scan signal SL1$j$ and connects the gate electrode and the second electrode of the first transistor T1 to each other to diode-connect the first transistor T1. A voltage difference is generated between the first electrode and the gate electrode of the first transistor T1 by threshold voltage of the first transistor T1 and the data signal having compensated threshold voltage is supplied to the gate electrode of the first transistor T1 to compensate a threshold voltage deviation of the first transistor T1.

The gate electrode of the second transistor T2 is connected to the terminal of the second scan signal SL1$j$. The second electrode of the fourth transistor T4 is connected to the terminal of the initialization voltage VINT. The first electrode of the fourth transistor T4 is connected to the first electrode of the storage capacitor Cst, the second electrode of the third transistor T3, and the gate electrode of the first transistor T1. The fourth transistor T2 is turned on in response to the second scan signal SL2$j$ and performs an operation of initializing voltage of the gate electrode the first transistor T1 by transferring the initialization voltage VINT to the gate electrode of the first transistor T1.

The gate electrode of the fifth transistor T5 is connected to the terminal of the emission control signal EM. The first electrode of the fifth transistor T5 is connected to the terminal of the first power voltage ELVDD. The second electrode of the fifth transistor T5 is connected to the first electrode of the first transistor T1 and the second electrode of the second transistor T2.

The gate electrode of the sixth transistor T6 is connected to the terminal of the emission control signal EM. The first electrode of the sixth transistor T6 is connected to the second electrode of the first transistor T1 and the first electrode of the third transistor T3. The second electrode of the sixth transistor T6 is connected to the anode electrode of the organic light emitting diode OLED.

The fifth transistor T5 and the sixth transistor T6 are simultaneously (e.g., concurrently) turned on in response to the emission control signal EM so that the driving current Id flows to the organic light emitting diode OLED.

The gate electrode of the seventh transistor T7 is connected to the terminal of a third scan signal SL3$j$. The first electrode of the seventh transistor T7 is connected to the anode electrode of the organic light emitting diode OLED. The second electrode of the seventh transistor T7 is connected to the terminal of the initialization voltage VINT. The seventh transistor T7 is turned on in response to the third scan signal SL3$j$ to initialize the anode electrode of the organic light emitting diode OLED.

The second electrode of the storage capacitor Cst is connected to the terminal of the first power voltage ELVDD. The first electrode of the storage capacitor Cst is together connected to the gate electrode the first transistor T1, the second electrode of the third transistor T3, and the first electrode of the fourth transistor T4. The cathode electrode of the organic light emitting diode OLED is connected to the terminal of the second power voltage ELVSS. The organic light emitting diode OLED emits light by receiving the driving current Ioled from the first transistor T1 to display an image.

Hereinafter, a structure of the organic light emitting display 70 will be described in more detail.

Figure 4:
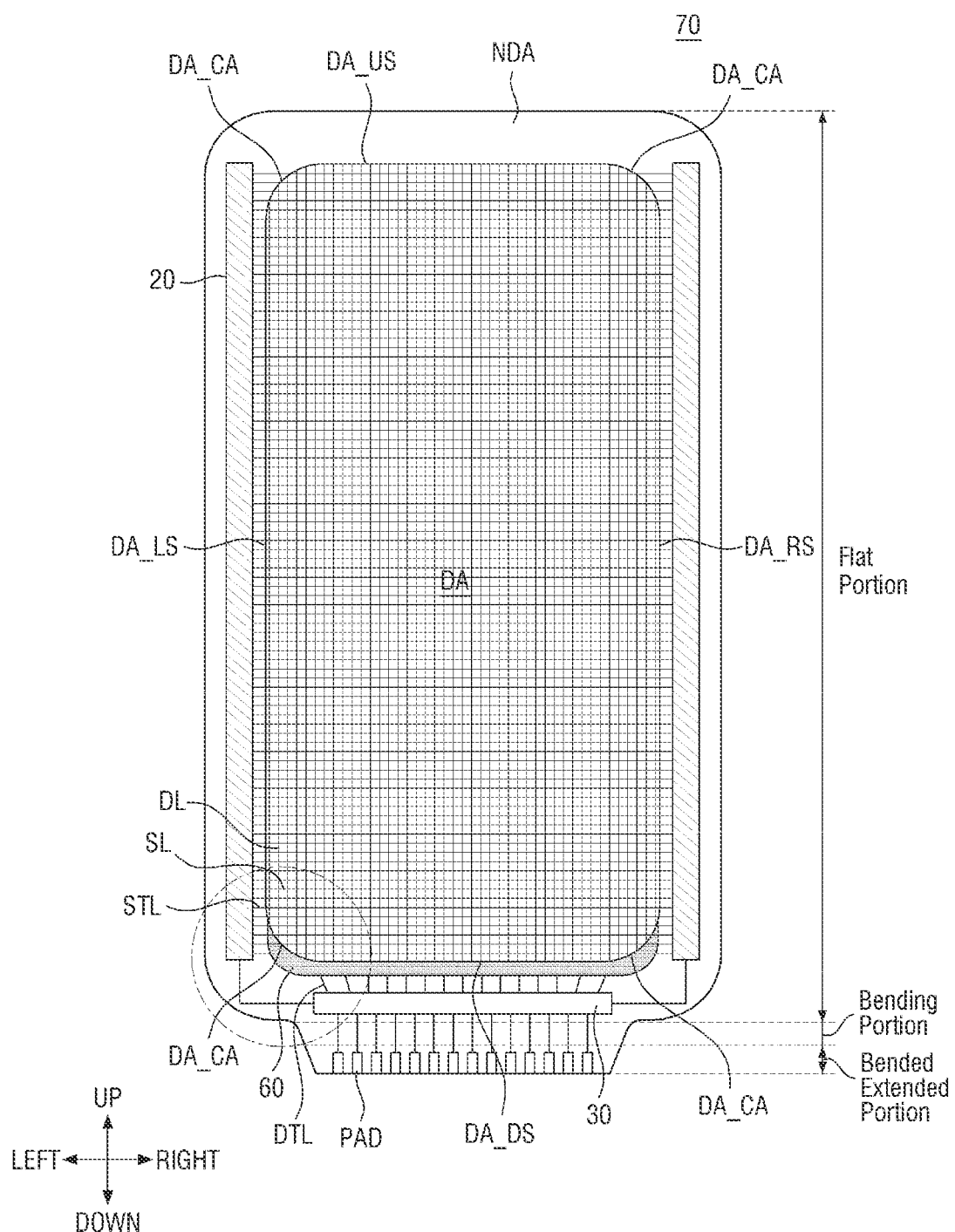
FIG. 4 is a plan layout view of the organic light emitting display according to some example embodiments.
Figure 5:
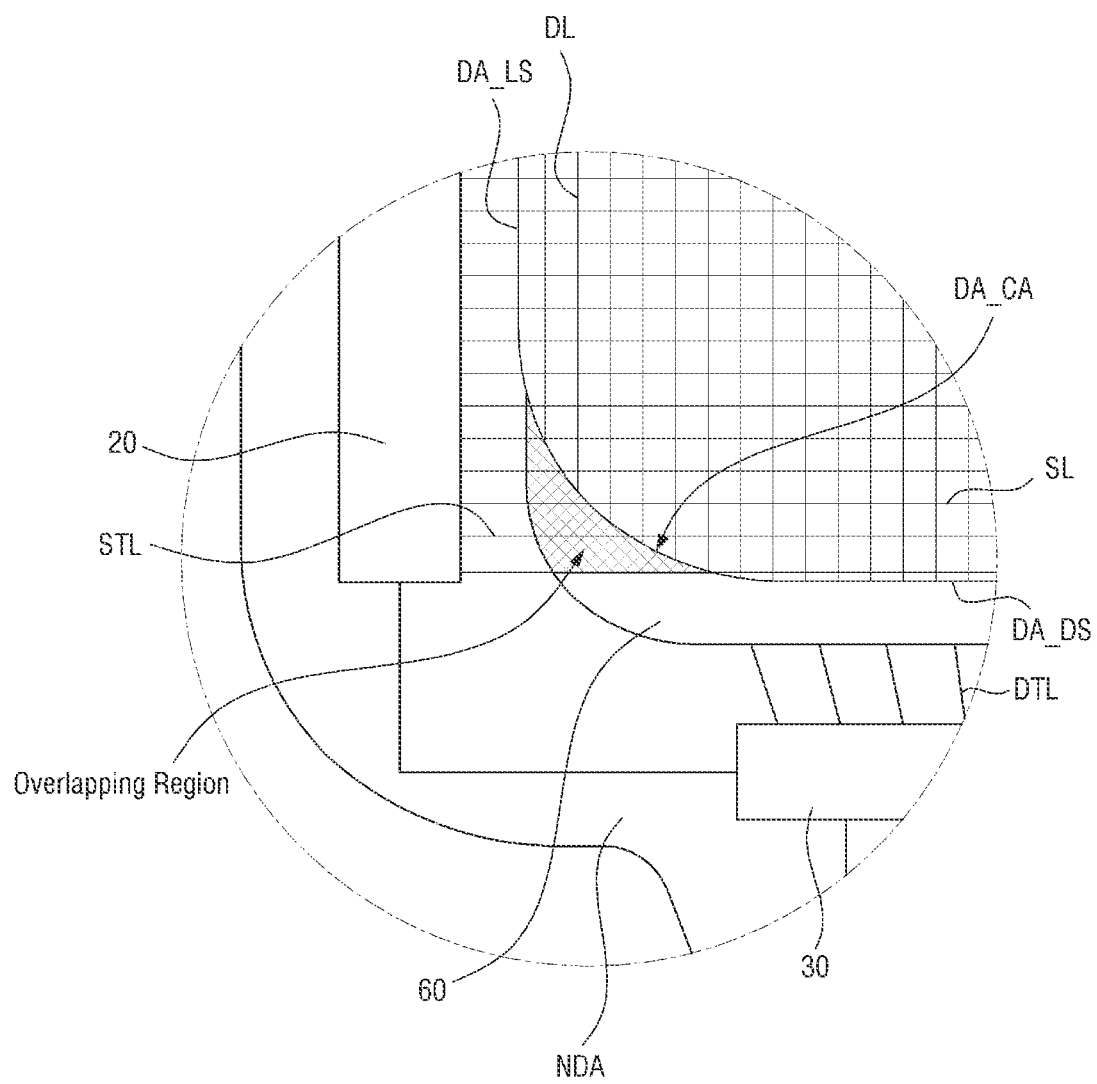
FIG. 5 is an enlarged diagram of a corner portion of a display area of FIG. 4.
Figure 6:
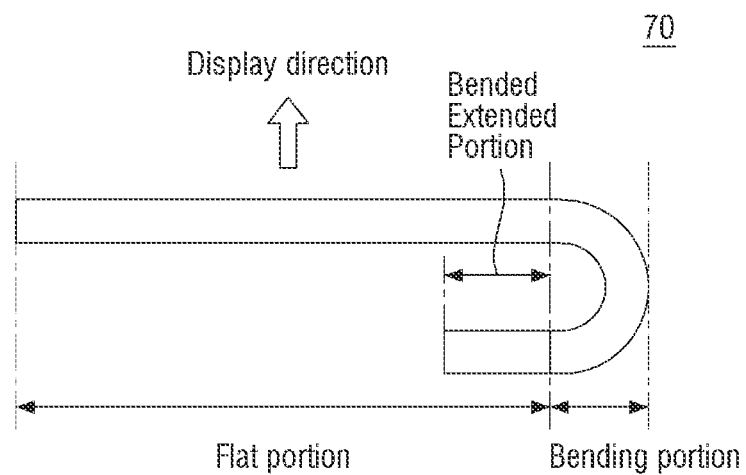
FIG. 6 is a cross-sectional view of the organic light emitting display of FIG. 4.

FIG. 4 is a plan layout view of the organic light emitting display according to the embodiment. FIG. 5 is an enlarged diagram of a corner portion of a display area of FIG. 4. FIG. 6 is a cross-sectional view of the organic light emitting display of FIG. 4. In FIG. 4, upper, lower, left, and right directions are defined for easy description. The upper and lower directions are vertical directions or column directions and the left and right direction are horizontal directions or row directions. It should be understood that the directions referred to in the embodiments are referred to as relative directions and the embodiments are not limited to the directions mentioned.

Referring to FIGS. 4 to 6, the organic light emitting diode display 70 includes a display area DA and a non-display area NDA located around the display area DA (e.g., outside a footprint of the display area DA from a plan view).

The display area DA is an area for displaying images. The display area DA includes a plurality of pixels. The display area DA has a generally planar shape similar to a rectangle, but a shape of a corner may be an irregular structure different from a typical rectangle.

Figure 7:
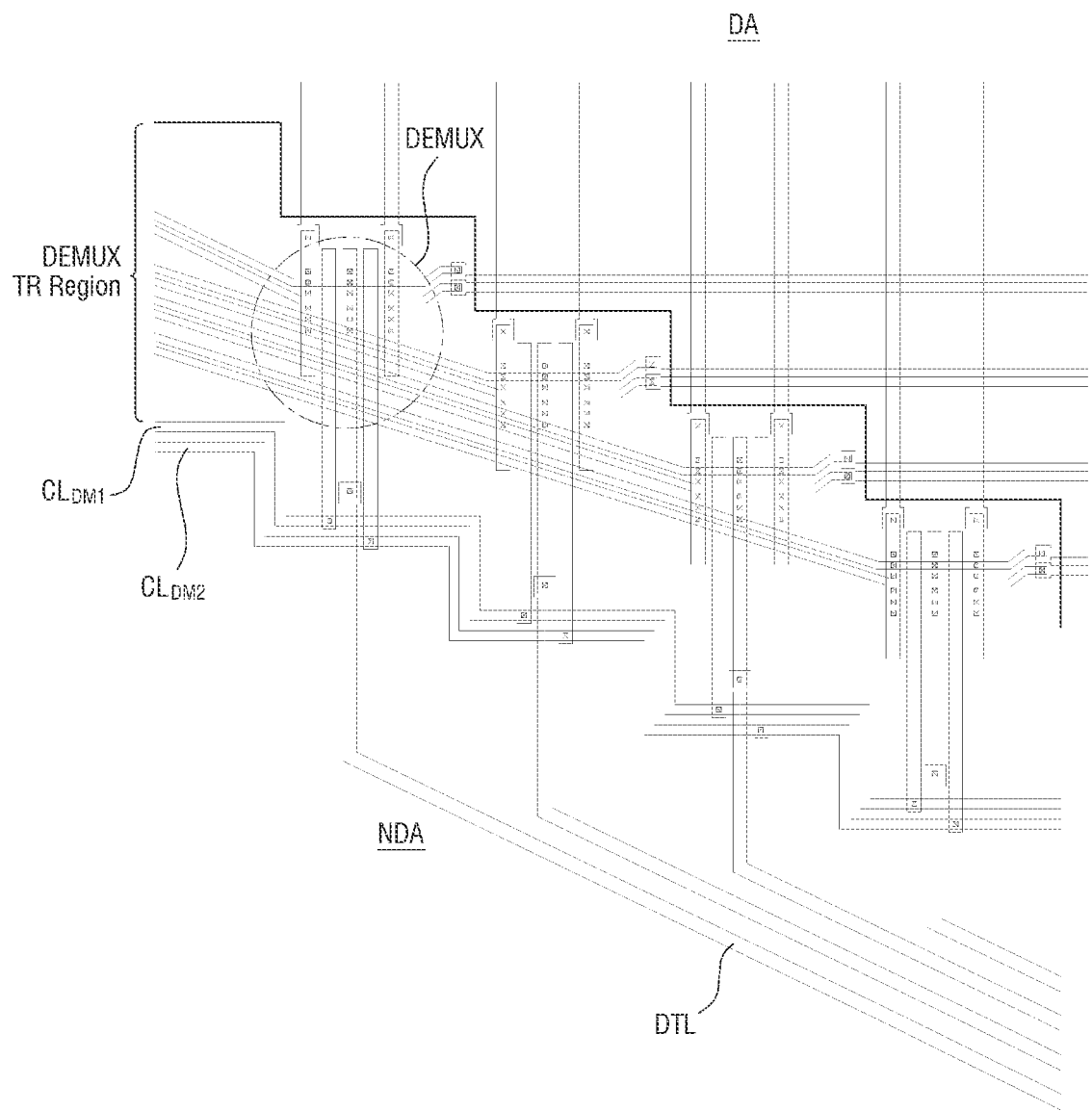
FIG. 7 is a layout view of the demultiplexing circuit unit according to some example embodiments.

Specifically, the display area DA may have four corner portions DA_CA among four sides of an upper side DA_US, a lower side DA_DS, a left side DA_LS, and a right side DA_RS. The upper side DA_US and the lower side DA_DS may be parallel and the left side DA_LS and the right side DA_RS may be parallel. The upper and lower sides DA_US and DA_DS and the left and right sides DA_LS and DA_RS may extend in a vertical direction, but the corner portions DA_CA located at portions where the upper and lower sides DA_US and DA_DS meet with the left and right sides DA_LS and DA_RS may not be vertical to each other, but may be inclined. That is, an internal angle of the corner portion DA_CA may be greater than 90°. The corner portion DA_CA may be an inclined straight shape or a rounded curved shape. The inclined or rounded shape mentioned above refers to a shape that is visually recognized and a detailed shape of an actual corner portion may be a step shape as illustrated in FIG. 7 and various other detailed shapes are possible.

A driver may be arranged in the non-display area NDA around the display area DA. For example, the scan driver 20 may be arranged on the left side DA_LS and/or the right side DA_RS of the display area DA and the demultiplexing circuit unit 60 and the data driver 30 may be arranged on the lower side DA_US of the display area DA. In the embodiment, the data driver 30 may be mounted in an IC form, while the scan driver 20 and the demultiplexing circuit unit 60 may formed directly on a substrate. The scan driver 20 and the demultiplexing circuit unit 60 may include a plurality of transistors and wirings and the transistors and wirings may be formed simultaneously (e.g., concurrently) when the transistor, the wiring, and the electrode of the pixel are formed.

When the scan driver 20 is arranged on the left side DA_LS and the right side DA_RS of the display area DA, the shapes thereof may be substantially the same. Hereinafter, the scan driver 20 located at the left side DA_LS of the display area DA will be described, but the same contents may also be applied to the scan driver 20 located at the right side DA_RS.

The scan driver 20 is arranged along the left side DA_LS of the display area DA. An output signal of the scan driver 20 is applied to the pixel of the display area DA in a horizontal direction through a scan transmission line STL. The scan transmission line STL connects an output terminal of the scan driver 20 and the scan line SL of the display area DA. The scan transmission line STL and the scan line SL may be formed on the same layer but may be formed on the other layer and may be electrically connected through a contact hole in a boundary portion between the display area DA and the non-display area NDA, for example, the non-display area NDA adjacent to the display area DA. A detailed description thereof will be described below.

A lower end and an upper end of the scan driver 20 may extend up to a lower corner portion DA_CA and an upper corner portion DA_CA connected to the left side DA_LS of the display area DA. The lower end and the upper end of the scan driver 20 may extend up to extension lines of the upper side DA_US and the lower side DA_DS of the display area DA and protrude to the outside therefrom. A horizontal separation distance from the corner portion DA_CA of the display area DA up to the scan driver 20 may be larger than the horizontal separation distance from the left side DA_LS of the display area DA up to the scan driver 20.

The demultiplexing circuit unit 60 is arranged closer than the data driver 30 based on the display area DA. The demultiplexing circuit unit 60 is arranged to be not only adjacent to the lower side DA_DS of the display area DA but also adjacent to the corner portion DA_CA connected to the lower side DA_DS of the display area DA. The demultiplexing circuit unit 60 extends in parallel along the lower side DA_DS of the display area DA and reaches the inclined corner portion DA_CA to be arranged in an inclined direction along the inclined corner portion DA_CA. That is, the planar shape of the demultiplexing circuit unit 60 may include an inclined shape corresponding to the planar shape of the corner portion DA_CA. The inclined shape of the demultiplexing circuit unit 60 includes a round shape, a step shape, a diagonal shape, and the like.

The demultiplexing circuit unit 60 may be spaced apart from the display area DA by a distance (e.g., a predetermined distance) or may be arranged to be in contact with the display area DA. When the demultiplexing circuit unit 60 is in contact with the display area DA, a distance between the demultiplexing circuit unit 60 and the display area DA is construed as 0. A distance from the corner portion DA_CA of the display area DA up to the demultiplexing circuit unit 60 may be substantially the same as the distance from the lower side DA_DS of the display area DA up to the demultiplexing circuit unit 60.

At least a part of the demultiplexing circuit unit 60 adjacent to the corner portion DA_CA of the display area DA may be arranged in a separation space between the scan driver 20 and the display area DA at the corresponding portion. The transistors constituting the demultiplexing circuit unit 60 and the scan driver 20 themselves do not overlap with each other in planar, but a part of the demultiplexing circuit unit 60 adjacent to the corner portion DA_CA of the display area DA may overlap with the scan transmission line STAL of the scan driver 20.

As such, when the demultiplexing circuit unit 60 is arranged adjacent to the inclined corner portion DA_CA of the display area DA, space utilization increases to reduce a dead space. A short-circuit problem that may occur as the demultiplexing circuit unit 60 and the scan transmission line STL overlap with each other may be solved by forming the wirings in combination with various conductive layers constituting a pixel circuit. Further detailed description thereof will be described below.

In the embodiment, the organic light emitting diode display 70 may include a flat portion and a bending portion. The bending portion may be arranged on at least one side of the flat portion. The bending portion may be bent in a direction (in a bottom direction in the case of a top emission type) opposite to a display direction based on the flat portion. A bending reference plane may be parallel to the flat portion. The bending portion may include a curved surface. The display area DA, the scan driver 20, the demultiplexing circuit unit 60, and the data driver 30 may be arranged in the flat portion, but the present invention is not limited thereto. A wiring pad PAD may be provided in the bending portion and a printed circuit board may be attached to the bending portion.

The organic light emitting diode display 70 may further include a bended extended portion extending from the bending portion. The bended extended portion overlaps with the flat portion. The bended extended portion may extend to overlap with a part of the display area DA, but is not limited thereto. The wiring pad PAD may be provided in the bended extended portion and the printed circuit board may be attached to the bended extended portion.

Figure 8:
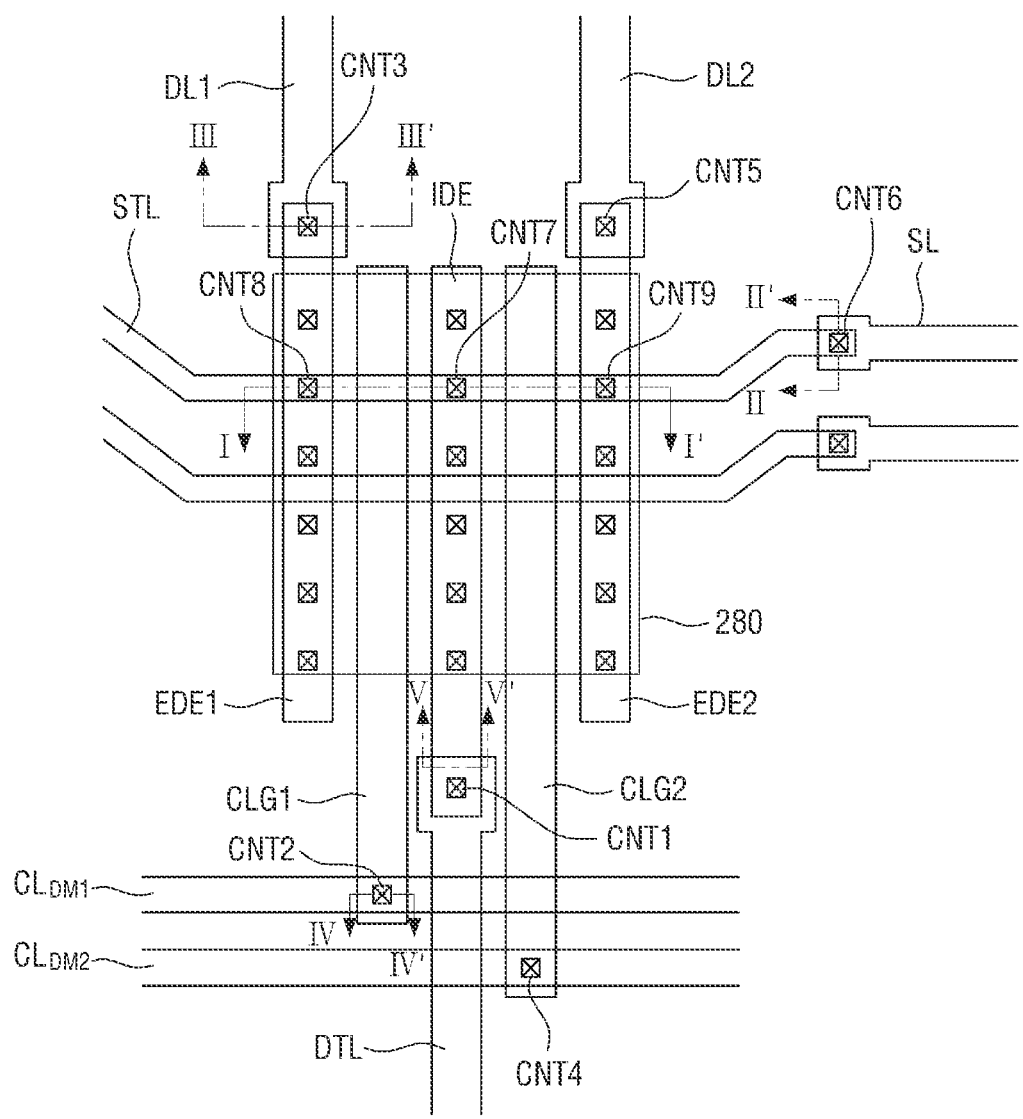
FIG. 8 is a layout view of a unit demultiplexer of FIG. 7.

FIG. 7 is a layout view of the demultiplexing circuit unit according to the embodiment. FIG. 7 is a partial layout view of the demultiplexing circuit unit adjacent to the corner portion of the display area. FIG. 8 is a layout view of a unit demultiplexer of FIG. 7.

Referring to FIGS. 7 and 8, in the corner portion, the display area DA may have a step-like boundary. A first demultiplexer selection line $CL_{DM1}$, a second demultiplexer selection line $CL_{DM2}$, and a data transmission line DTL are sequentially arranged below the display area DA. A demultiplexer transistor area is arranged between the first and second demultiplexer selection lines $CL_{DM1}$ and $CL_{DM2}$.

The first demultiplexer selection line $CL_{DM1}$ and the second demultiplexer selection line $CL_{DM2}$ are arranged adjacent to each other and extend in a shape corresponding to the step shape of the corner portion of the display area DA.

A plurality of data transmission lines DTL extend obliquely in a direction (e.g., an upper left direction) which is substantially the same as the inclined direction of the corner portion of the display area DA and is each bent upward to enter the demultiplexer transistor area. The plurality of data transmission lines DTL may intersect with the first and second demultiplexer selection lines $CL_{DM1}$ and $CL_{DM2}$.

A data input electrode IDE, first and second demultiplexer gate electrodes CLG1 and CLG2, and first and second data output electrodes EDE1 and EDE2 which each extend in a vertical direction are arranged in the demultiplexer transistor area. The first demultiplexer gate electrode CLG1 and the first data output electrode EDE1 are sequentially arranged in a left direction and the second demultiplexer gate electrode CLG2 and the second data output electrode EDE2 are sequentially arranged in a right direction of the data input electrode IDE. The data input electrode IDE and the first data output electrode EDE1 are opposed to each other with the first demultiplexer gate electrode CLG1 interposed therebetween and the data input electrode IDE and the second data output electrode EDE2 are opposed to each other with the second demultiplexer gate electrode CLG2 interposed therebetween.

A semiconductor layer 280 is arranged to overlap with the data input electrode IDE, the first and second demultiplexer gate electrodes CLG1 and CLG2, and the first and second data output electrodes EDE1 and EDE2.

The lower end of the data input electrode IDE is connected to the data transmission line DTL through the contact hole. The lower end of the first demultiplexer gate electrode CLG1 is connected to the first demultiplexer selection line $CL_{DM1}$ through a contact hole CNT2. The upper end of the first data output electrode EDE1 is connected to the first data line DL1 through a contact hole CNT3. Further, the lower end of the second demultiplexer gate electrode CLG2 is connected to the second demultiplexer selection line CLDM2 through a contact hole CNT4. The upper end of the second data output electrode EDE2 is connected to the second data line DL2 through a contact hole CNT5.

The data input electrode IDE, the first data output electrode EDE1, and the first demultiplexer gate electrode CLG1 constitute a first demultiplexer transistor ($T_{DM1}$ in FIG. 10) having the semiconductor layer 280 as a channel. Further, the data input electrode IDE, the second data output electrode EDE2, and the second demultiplexer gate electrode CLG2 constitute a second demultiplexer transistor ($T_{DM2}$ in FIG. 10) having the semiconductor layer 280 as the channel. The first demultiplexer transistor $T_{DM1}$ and the second demultiplexer transistor $T_{DM2}$ may share the first electrode and each channel may be provided as one integrated semiconductor layer 280.

Meanwhile, the scan transmission line STL for transferring the output signal of the scan driver may pass through the demultiplexer transistor area. The scan transmission line STL extends obliquely along the demultiplexer transistor area and reaches a pixel row in charge to be connected to the scan line SL, or the like. The scan transmission line STL may be connected to the scan line SL, or the like through a contact hole CNT6. In the drawing, it is illustrated that two scan transmission lines STL extend parallel to the demultiplexer transistor area and are connected to the scan lines SL, respectively in a step of in one display area DA. However, one scan transmission line STL may be traversed or three or more scan transmission lines STL may be traversed for each step of the display area DA.

The scan transmission line STL may overlap or intersect with at least one electrode of the demultiplexer transistors $T_{DM1}$ and $T_{DM2}$. Furthermore, the scan transmission line STL may overlap or intersect with at least one of the first demultiplexer selection line $CL_{DM1}$, the second demultiplexer selection line $CL_{DM2}$, and the data transmission line DTL. One of the methods to prevent or reduce instances of the wirings being short-circuited in spite of overlapping or intersection is to form the wirings which overlap or intersect by using conductive layers formed in different layers with an insulating film interposed therebetween. Accordingly, the scan transmission line STL may be formed of conductive layers of a different layer from the data input electrode IDE, the first and second demultiplexer data output electrodes EDE1 and EDE2, the first and second demultiplexer gate electrodes EDL1 and EDE2 which are conductive layers constituting the demultiplexer transistors $T_{DM1}$ and $T_{DM2}$. Further, the scan transmission line STL may be formed of the conductive layers of the different layer from the first demultiplexer selection line $CL_{DM1}$, the second demultiplexer selection line $CL_{DM2}$, and the data transmission line DTL. The organic light emitting diode display 70 includes a plurality of conductive layers in order to constitute the pixel circuit. By applying and combining the conductive layers to and with the electrodes of the scan transmission line STL and the demultiplexing circuit unit 60, it may be possible to prevent or reduce incidences of the wirings which overlap or intersect being short-circuited. The organic light emitting diode display will be described in more detail with reference to FIGS. 9 and 10.

Figure 9:
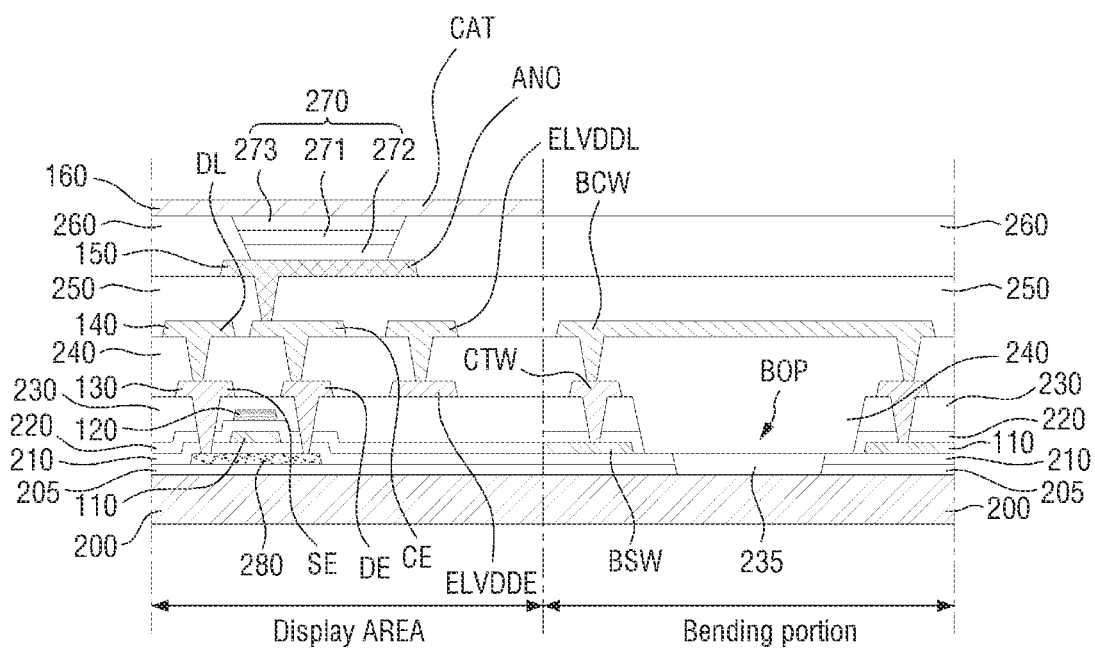
FIG. 9 is a cross-sectional view of a pixel and a bending part of the organic light emitting display according to some example embodiments.
Figure 10:
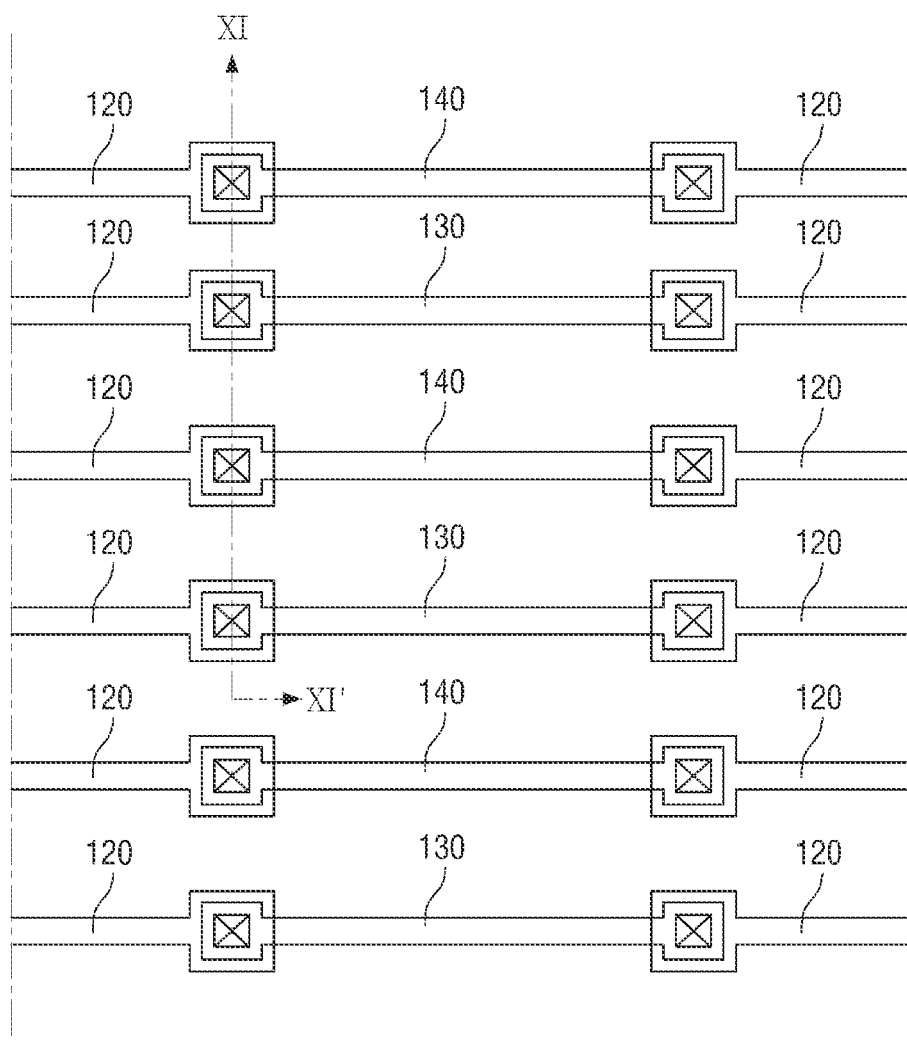
FIG. 10 is a layout view of the bending part of the organic light emitting display according to some example embodiments.
Figure 11:
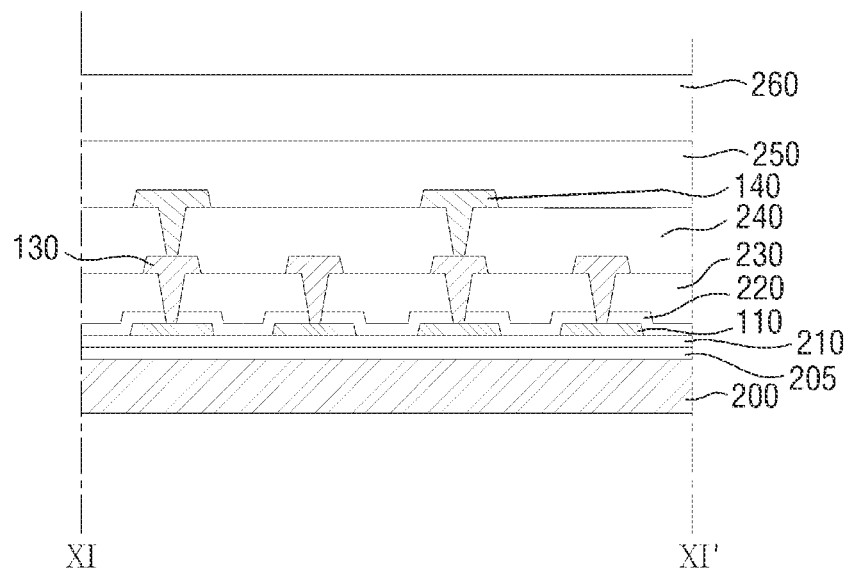
FIG. 11 is a cross-sectional view taken along line XI-XI' of FIG. 10.
Figure 12:
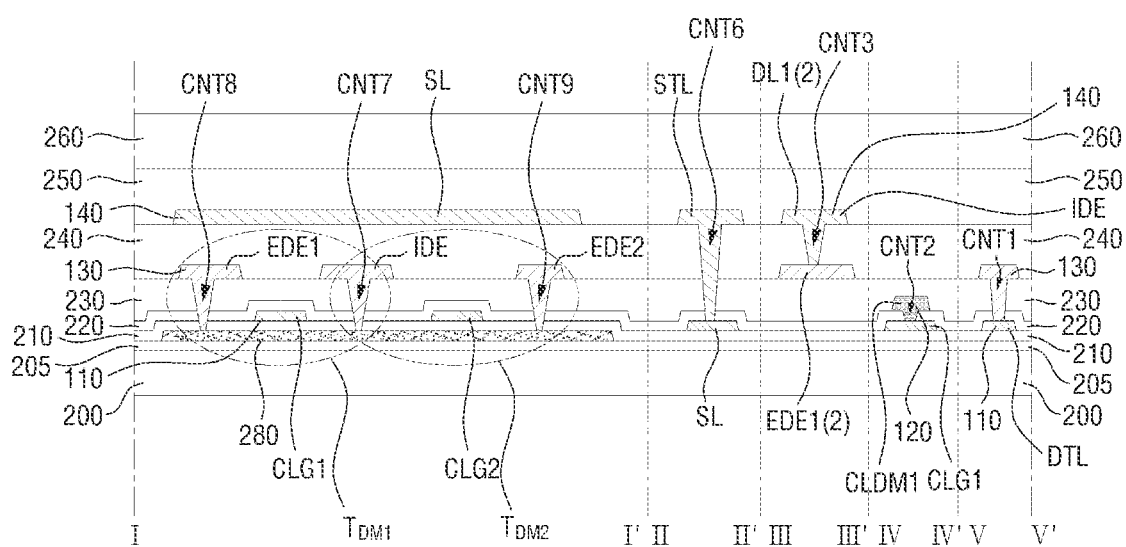
FIG. 12 is a cross-sectional view of a demultiplexer transistor area and a contact hole area of the organic light emitting display according to some example embodiments.

FIG. 9 is a cross-sectional view of a pixel and a bending portion of the organic light emitting display according to the embodiment. FIG. 10 is a layout view of the bending portion of the organic light emitting display according to some example embodiments. FIG. 11 is a cross-sectional view taken along the line XI-XI' of FIG. 10. FIG. 12 is a cross-sectional view of a demultiplexer transistor area and a contact hole area of the organic light emitting display according to some example embodiments and is a cross-sectional view taken along the lines I-I', II-II', III-III', IV-IV', and V-V' of FIG. 8.

In FIGS. 9 to 12, new reference numerals have been additionally given and occasionally written in order to clarify an interlayer structure with respect to the same constituent elements as those mentioned in FIGS. 1 to 8 with respect to some constituent elements. In the embodiment of FIGS. 9 to 12, it is described that six conductive layers are formed from the gate electrode to the cathode electrode of the pixel.

When a cross-sectional structure of the organic light emitting diode is described with reference to FIGS. 7 to 12, a layer structure of the organic light emitting display may include a substrate 200, a buffer layer 205, a semiconductor layer 280, a first insulating layer 210, a first conductive layer 110, a second insulating layer 220, a second conductive layer 120, a third insulating layer 230, a bending insulating layer 235, a third conductive layer 130, a fourth insulating layer 240, a fourth conductive layer 140, a fifth insulating layer 250, a fifth conductive layer 150, a pixel defining layer 260 including an opening exposing the fifth conductive layer 150, an organic layer 270 arranged in the opening of the pixel defining layer 260, and a sixth conductive layer 160 arranged on the organic layer 270 and the pixel defining layer 260. Each of the layers described above may be formed of a single film, but may also be formed of a laminated film including a plurality of films. Other layers may be further arranged among the respective layers.

The substrate 200 supports the respective layers arranged thereon. The substrate 200 may be formed of an insulating material such as a polymer resin, or the like. Examples of the polymer material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 200 may be a flexible substrate 200 which may be bent, folded, rolled, and the like. An example of the material constituting the flexible substrate is polyimide (PI), but is not limited thereto. The substrate 200 may be a rigid substrate made of glass, quartz, or the like.

The buffer layer 205 is arranged on the substrate 200. The buffer layer 205 may prevent or reduce diffusion of impurity ions, prevent or reduce penetration of moisture or outside air, and perform a surface planarization function. The buffer layer 205 may contain silicon nitride, silicon oxide, or silicon oxynitride. The buffer layer 205 covers most of the display area DA and the non-display area NDA of the substrate 200, but is removed from a part of (a bending opening portion (BOP) of the bending portion to expose the surface of the substrate 200. The buffer layer 205 may be omitted according to a type or a process condition of the substrate 200.

The semiconductor layer 280 is arranged on the buffer layer 205. The semiconductor layer 280 forms the channels of the first to seventh transistors T1 to T7 of the pixel 1 and the first and second demultiplexer transistors $T_{DM1}$ and $T_{DM2}$ of the demultiplexer DEMUX. The semiconductor layer 280 may include polycrystalline silicon. The polycrystalline silicon may be formed of crystallizing amorphous silicon. Examples of the crystallization method may include a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like, but the present invention is not limited thereto. A portion (source/drain area) connected to a source/drain electrode of each transistor in the semiconductor layer 280 may be doped with impurity ions (p-type impurity ions in the case of a PMOS transistor). A trivalent dopant such as boron (B) may be used as a p-type impurity ion.

In another embodiment, the semiconductor layer 280 may include monocrystalline silicon, low temperature polycrystalline silicon, amorphous silicon, or an oxide semiconductor. The oxide semiconductor may include, for example, a binary compound (ABx), a ternary compound (ABxCy), a quartz-based compound (ABxCyDz) containing indium, zinc, gallium, tin, titanium, aluminum, hafnium (Hf), zirconium (Zr), magnesium (Mg), and the like. In the embodiment, the semiconductor layer 280 may include ITZO (an oxide comprising indium, tin, or titanium) or IGZO (an oxide including indium, gallium, and tin).

The first insulating layer 210 may be a gate insulating film having a gate insulating function. The first insulating layer 210 may include a silicon compound, a metal oxide, and the like. For example, the first insulating layer 210 may include silicon oxide, silicon nitride, silicon oxynitride, aluminum oxide, tantalum oxide, hafnium oxide, zirconium oxide, titanium oxide, and the like. Silicon oxide, silicon nitride, silicon oxynitride, aluminum oxide, tantalum oxide, hafnium oxide, zirconium oxide, titanium oxide, and the like may be used singly or combinationally with each other. The first insulating layer 210 may be a single film or a multilayer film composed of a laminated film of different materials.

The first insulating layer 210 may be arranged on the semiconductor layer 280 and may be arranged over the entire surface of the substrate 200. However, the first insulating layer 210 is removed together with the buffer layer 205 in a part of the bending portion (the bending opening BOP) to expose the surface of the substrate 200.

The first conductive layer 110 is arranged on the first insulating layer 210. The first conductive layer 110 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The first conductive layer 110 may be the single film or the multilayer film.

The gate electrodes of the first to seventh transistors T1 to T7 of the pixel 1 and the scan line SL connected thereto may be formed of the first conductive layer 110. The first demultiplexer gate electrode CLG1 and the second demultiplexer gate electrode CLG2 of the demultiplexer DEMUX may also be formed of the first conductive layer 110. Further, the first demultiplexer selection line CLDM1 and the second demultiplexer selection line CLDM2, and the data transmission line DTL may also be formed of the first conductive layer 110. Further, the first conductive layer 110 may be used as a bending signal wiring BSW with a part acquired by removing the buffer layer 205 and the first insulating layer 210 from the bending portion interposed therebetween. The first conductive layer 110 used as the bending signal wiring BSW in the bending portion may be electrically connected by a bending connection wiring BCW formed of the fourth conductive layer 140 crossing the bending opening portion BOP through a contact wiring CTW formed of the third conductive layer.

The second insulating layer 220 serves to insulate the first conductive layer 110 and the second conductive layer 120 from each other. The second insulating layer 110 may be arranged on the first conductive layer 110 and generally arranged over the entire surface of the substrate 200. However, the second insulating layer 210 is removed from a part of the bending portion (the bending opening BOP) to expose the buffer layer 205 and the first insulating layer 210.

The second insulating layer 220 may be an interlayer insulating layer. The second insulating layer 220 may include an inorganic insulating material such as silicon oxide, silicon nitride, silicon oxynitride, hafnium oxide, aluminum oxide, titanium oxide, tantalum oxide, zinc oxide, or the like or an organic insulating material such as a polyacrylates resin, an epoxy resin, a phenolic resin, a polyamides resin, a polyimides resin, an unsaturated polyesters resin, a polyphenylenethers resin, a polyphenylene resin, a polyphenylene resin, a polyphenylenesulfides resin, or benzocyclobutene (BCB). The second insulating layer 220 may be the single film or the multilayer film including the laminated film of different materials.

The second conductive layer 120 is arranged on the second insulating layer 220. The second electrode, the first demultiplexer selection line $CL_{DM1}$, and the second demultiplexer selection line $CL_{DM2}$ of the storage capacitor Cst of the pixel 1 may be formed of the second conductive layer 120. The first demultiplexer selection line $CL_{DM1}$ and the second demultiplexer selection line $CL_{DM2}$ may be electrically connected to the first demultiplexer gate electrode CLG1 and the second demultiplexer gate electrode CLG2 formed of the first conductive layer 110 through the contact holes CNT2 and CNT4 penetrating the second insulating layer 220.

The second conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The second conductive layer 120 may be made of the same material as the first conductive layer 110, but is not limited thereto. The second conductive layer 120 may be the single film or the multilayer film.

The third insulating layer 230 covers the second conductive layer 120. The third insulating layer 230 covers the second conductive layer 120 and the third conductive layer 130. The third insulating layer 230 is generally arranged over the entire surface of the substrate 200, but may be removed from a part of the bending portion (bending opening BOP). The buffer layer 205, the first insulating layer 210, the second insulating layer 220 and the third insulating layer 230 partially removed from the bending portion together expose the substrate 200 and defines the bending opening BOP. The bending opening portion BOP may serve to reduce bending stress.

The bending opening portion BOP may expose the buffer layer 205 and the first insulating layer 210 together with the second insulating layer 220.

The third insulating layer 230 may be the interlayer insulating layer. The third insulating layer 230 may include the inorganic insulating material such as silicon oxide, silicon nitride, silicon oxynitride, hafnium oxide, aluminum oxide, titanium oxide, tantalum oxide, zinc oxide, or the like or the organic insulating material such as the polyacrylates resin, the epoxy resin, the phenolic resin, the polyamides resin, the polyimides resin, the unsaturated polyesters resin, the polyphenylenethers resin, the polyphenylene resin, the polyphenylene resin, the polyphenylenesulfides resin, or benzocyclobutene (BCB). The third insulating layer 230 may be the single film or the multilayer film composed of the laminated film of different materials.

The bending insulating layer 235 is arranged in the bending opening BOP. The bending insulating layer 235 may not be arranged in the display region but may be arranged only in the bending portion. A surface height of the bending insulating layer 235 may be lower than that of the third insulating layer 230. The bending insulating layer 235 may be a via layer. The bending insulating layer 235 may include the organic insulating material such as the polyacrylates resin, the epoxy resin, the phenolic resin, the polyamides resin, the polyimides resin, the unsaturated polyesters resin, the polyphenylenethers resin, the polyphenylene resin, the polyphenylene resin, the polyphenylenesulfides resin, or benzocyclobutene (BCB).

The third conductive layer 130 is arranged on the third insulating layer 230. The first electrode and the second electrode a thin film transistor of the pixel 1 may be formed of the third conductive layer 130. The first electrode SE and the second electrode DE of the thin film transistor may be electrically connected to the source area and the drain area of the semiconductor layer 280 through the contact hole penetrating the third insulating layer 230, the second insulating layer 220, and the first insulating layer 210. A first power voltage electrode ELVDDE of the pixel 1 may also be formed of the third conductive layer 130.

Further, the data input electrode IDE, the first data output electrode EDE1, and the second data output electrode EDE2 of the demultiplexer DEMUX may be formed of the third conductive layer 130. The data input electrode IDE may be electrically connected to the source area of the semiconductor layer 280 through the contact hole CNT7 penetrating the third insulating layer 230, the second insulating layer 220, and the first insulating layer 210 and the first data output electrode EDE1 and the second data output electrode EDE2 may be electrically connected to of the drain area of the semiconductor layer 280 through contact holes CNT7 and CNT9 penetrating the third insulating layer 230, the second insulating layer 220, and the first insulating layer 210, respectively. The data input electrode IDE may be connected to the data transmission line DTL formed of the first conductive layer 110 through the contact hole CNT1 penetrating the third insulating layer 230 and the second insulating layer 220. Further, in the bending portion, the contact wiring CTW is formed of the third conductive layer 130 and is electrically connected to the lower bending signal wiring BSW.

The third conductive layer 130 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The third conductive layer 130 may be the single film or the multilayer film. For example, the third conductive layer 130 may have a lamination structure such as Ti/Al/Ti, Mo/Al/Mo, Mo/AlGe/Mo, Ti/Cu, or the like.

The fourth insulating layer 240 covers the third conductive layer 130. In the bending portion, the fourth insulating layer 240 is arranged on the bending insulating layer 235.

The fourth insulating layer 240 may be the via layer. The fourth insulating layer 240 may include the same material as the bending insulating layer 235 or include at least one material selected from the example constituent materials of the bending insulating layer 235.

The fourth conductive layer 140 is arranged on the fourth insulating layer 240. The data line DL, the connection electrode CE, and the first power voltage line ELVDDL of the pixel 1 may be formed of the fourth conductive layer 140.

The data line DL may be electrically connected to the first electrode SE of the thin film transistor of the pixel 1 through the contact hole passing through the fourth insulating layer 240 in the pixel 1. The data line DL may also be connected to the first data output electrode EDE1 and the second data output electrode EDE2 through the contact holes CNT3 and CNT5 penetrating the fourth insulating layer 240 in the demultiplexer transistor area.

The connection electrode CE may be electrically connected to the second electrode DE of the thin film transistor of the pixel 1 through the contact hole penetrating the fourth insulating layer 240. The first power voltage line ELVDDL may be electrically connected to the first power voltage electrode ELVDDE through the contact hole penetrating the fourth insulating layer 240.

The scan transmission line STL may also be formed of the fourth conductive layer 140. The scan transmission line STL may be electrically connected to the scan line SL formed of the first conductive layer 110 through the contact hole CNT6 penetrating the fourth insulating layer 240, the third insulating layer 230, and the second insulating layer 210. Further, in the bending portion, the bending connection wiring BCW crossing the bending opening portion BOP may also be formed of the fourth conductive layer 140. The bending connection wiring BCW may connect the bending signal wiring BSW which is separated from the center of the bending opening portion BOP in contact with the contact wiring CTW through the contact hole penetrating the fourth insulating layer 240.

Although it is illustrated that the bending connection wiring BCW is formed of the fourth conductive layer 140 in FIG. 9, the bending connection wiring BCW may be formed of the third conductive layer 130 or may be applied in combination thereof. For example, as illustrated in FIGS. 10 and 12, the bending connection wiring formed of the fourth conductive layer 140 and the bending connection wiring formed of the third conductive layer 130 may be alternately arranged in the bending portion. When the bending connection wiring is formed of the third conductive layer 130, the fourth conductive layer 140 may not overlap on the bending connection wiring.

The fourth conductive layer 140 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The fourth conductive layer 140 may be the single film or the multilayer film. The fourth conductive layer 140 may be made of the same material as the third conductive layer 130, but is not limited thereto.

The fifth insulating layer 250 is arranged on the fourth conductive layer 140. The fifth insulating layer 250 covers the fourth conductive layer 140. The fifth insulating layer 250 may be the via layer. The fifth insulating layer 250 may include the same material as the bending insulating layer 235 or include at least one material selected from the example constituent materials of the bending insulating layer 235.

The fifth conductive layer 150 is arranged on the fifth insulating layer 250. An anode electrode ANO of the pixel 1 may be formed of the fifth conductive layer 150. The anode electrode ANO may be electrically connected to the connection electrode CE formed of the fourth conductive layer 140 through the contact hole penetrating the fifth insulating layer 250 and connected to the second electrode DE of the thin film transistor through the contact hole penetrating the fifth insulating layer 250.

The fifth conductive layer 150 is not limited thereto, but may have a lamination layer structure in which a material layer having a high work function of indium-tin-oxide (ITO), indium-zinc-oxide (IZO), zinc oxide (ZnO), and indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chrome (Cr), lithium (Li), calcium (Ca) or a mixture thereof are laminated. The layer having the high work function may be arranged above the reflective material layer and arranged close to an organic layer 270. The fifth conductive layer 150 may have a multilayer structure of ITO/Mg, ITO/MgF, ITO/Ag, and ITO/Ag/ITO, but the present invention is not limited thereto.

The pixel defining layer 260 may be arranged on the fifth conductive layer 150. The pixel defining layer 260 may include an opening exposing the fifth conductive layer 150. The pixel defining layer 260 may include the inorganic insulating material such as silicon oxide, silicon nitride, silicon oxynitride, hafnium oxide, aluminum oxide, titanium oxide, tantalum oxide, zinc oxide, or the like or the organic insulating material such as the polyacrylates resin, the epoxy resin, the phenolic resin, the polyamides resin, the polyimides resin, the unsaturated polyesters resin, the polyphenylenethers resin, the polyphenylene resin, the polyphenylene resin, the polyphenylenesulfides resin, or benzocyclobutene (BCB). The pixel defining layer 260 may be the single film or the multilayer film composed of the laminated film of different materials.

The organic layer 270 is arranged in the opening of the pixel defining layer 260. The organic layer 270 may include an organic light emitting layer 271, a hole injection/transport layer 272, and an electron injection/transport layer 273. Although it is illustrated that the hole injection/transport layer 272 and the electron injection/transport layer 273 are formed of one layer in the drawing, a plurality of layers of the injection layer and the transport layer may be laminated.

The sixth conductive layer 160 is arranged on the organic layer 270 and the pixel defining layer 260. The cathode electrode (CAT) may be formed of the sixth conductive layer 160. The cathode electrode CAT may be arranged over the entire display area. The sixth conductive layer 160 may include a material layer having a small work function such as Li, Ca, LiF/Ca, LiF/Al, Al, Mg, Ag, Pt, Pd, Ni, Au Nd, Ir, Cr, BaF, Ba or a compound or a mixture (e.g., a mixture of Ag and Mg). The sixth conductive layer 160 may further include a transparent metal oxide layer arranged on the material layer having the small work function.

In the embodiment described above, the demultiplexing circuit unit 60 is arranged adjacent to the inclined corner portion of the display area DA to increase space utilization and the first and second demultiplexer gate electrodes CLG1 and CLG2 of the demultiplexer DEMUX are formed of the first conductive layer 130, and the data input electrode IDE and the first and second demultiplexer data output electrodes EDE1 and EDE2 are formed of the third conductive layer 130, while the scan line SL is formed of the fourth conductive layer 140 to effectively the short-circuit problem which may occur as the demultiplexing circuit unit 60 and the scan transmission line STL overlap with each other.

The organic light emitting diode display 70 according to the embodiment is not limited thereto, but may be manufactured through 11 mask processes. Because a specific mask process may be sufficiently inferred through a manufactured structure, the specific mask process will be omitted.

Hereinafter, other embodiments will be described.

Figure 13:
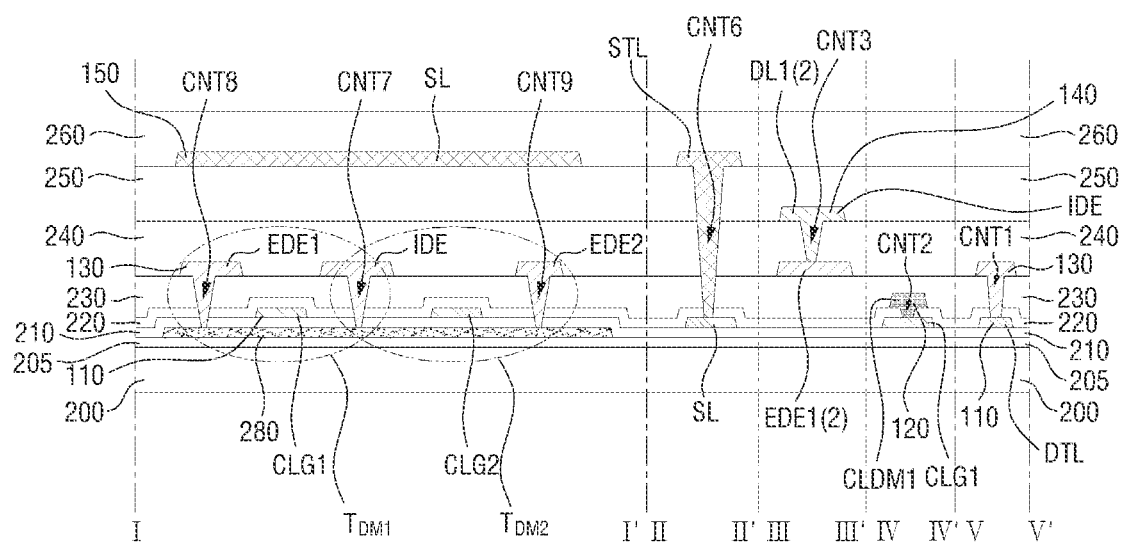
FIG. 13 is a cross-sectional view of a demultiplexer transistor area and a contact hole area of the organic light emitting display according to some example embodiments.

FIG. 13 is a cross-sectional view of a demultiplexer transistor area and a contact hole area of the organic light emitting display according to another embodiment. Referring to FIG. 13, in some example embodiments, the organic light emitting display according to the embodiment may use the fifth conductive layer 150 as the scan transmission line STL. The embodiments of FIG. 13 is different from the embodiment of FIG. 10 in that the contact hole CNT6 connecting the scan transmission line STL and the scan line SL further penetrate the fifth insulating layer 250.

Even when the scan transmission line STL is formed of the fifth conductive layer 150 as described in the embodiment, because the scan transmission line STL is insulated from the data input electrode IDE and the first and second demultiplexer data output electrodes EDE1 and EDE2 of the demultiplexer DEMUX formed of the third conductive layer 130, it is possible to solve the short-circuit problem in an overlapping region. Although not illustrated in the drawing, as long as the scan transmission line STL is formed of the fifth conductive layer 150, even though at least one of the data input electrode IDE and the first and second demultiplexer data output electrodes EDE1 and EDE2 of the demultiplexer DEMUX is formed of the fourth conductive layer 140, insulation from the scan transmission line STL may be maintained in the overlapping region.

Figure 14:
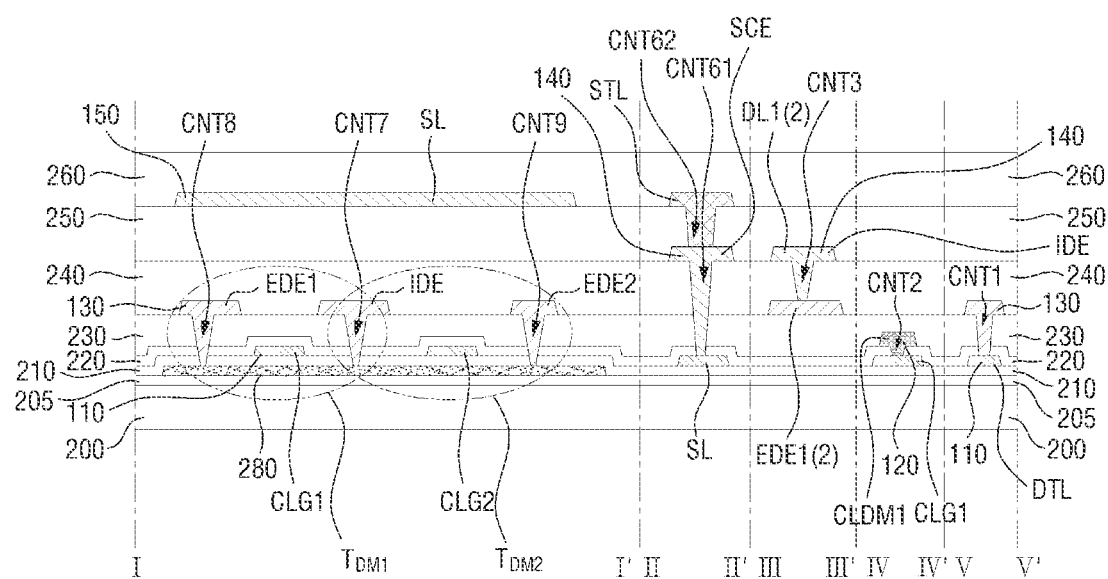
FIG. 14 is a cross-sectional view of a demultiplexer transistor area and a contact hole area of an organic light emitting display according to some example embodiments.

FIG. 14 is a cross-sectional view of a demultiplexer transistor area and a contact hole area of an organic light emitting display according to still another embodiment.

FIG. 14 illustrates that contacts penetrating the various layers may pass through other intermediate connection electrodes. Referring to FIG. 14, in the embodiment, the embodiment of FIG. 14 is the same as the embodiment of FIG. 13 in that the scan transmission line STL is formed of the fifth conductive layer 150, but the embodiment of FIG. 14 is different from the embodiment of FIG. 13 in that the scan transmission line STL further includes a scan connection electrode SCE formed of the fourth conductive layer 140. The scan transmission line STL is electrically connected to the scan connection electrode SCE formed of the fourth conductive layer 140 through A contact hole CNT 62 penetrating the fifth insulating layer 250. The scan connection electrode SCE is electrically connected to the scan line SL formed of the first conductive layer 110 through a contact hole CNT61 penetrating the fourth insulating layer 240, the third insulating layer 230, and the second insulating layer 220. Consequently, the scan transmission line STL may be electrically connected to the scan line SL through the scan connection electrode SCE.

According to a display device of an embodiment, demultiplexers are arranged along rounded corner in a panel of which corners are round to minimize or reduce a wasted area.

In addition, even if driving circuits overlap at rounded corners, wiring is formed using another metal layer, thereby preventing or reducing instances of a short circuit between the driving circuits.

The effects of the present invention are not limited by the foregoing, and other various effects are anticipated herein.

Although aspects of some example embodiments of the present invention have been disclosed for illustrative purposes, those skilled in the art will appreciate that various modifications, additions and substitutions are possible, without departing from the scope and spirit of the invention as disclosed in the accompanying claims, and their equivalents.

What is claimed is:

1. A display device, comprising:
    a display area including a pixel circuit comprising a pixel transistor, a scan line connected to a gate electrode of the pixel transistor, and a data line connected to a first electrode of the pixel transistor; and
    a non-display area adjacent to the display area, the non-display area including a demultiplexing circuit unit and a scan transmission line connected to the scan line and overlapping with the demultiplexing circuit unit,
    wherein the demultiplexing circuit unit comprises a demultiplexer transistor including a demultiplexer gate electrode in a same layer as the gate electrode of the pixel transistor, a data input electrode and a data output electrode in a same layer as the first electrode of the pixel transistor, and
    wherein the scan transmission line is located in a different conductive layer from the pixel transistor and the demultiplexer transistor.

2. The display device of claim 1, wherein the non-display area further comprises a demultiplexer selection line connected to the demultiplexer gate electrode,
    the gate electrode and the demultiplexer gate electrode are located in a first conductive layer, and
    the demultiplexer selection line is in a second first conductive layer on the first conductive layer.

3. The display device of claim 2, wherein the pixel circuit further comprises a storage capacitor comprising a first electrode and a second electrode,
    wherein the first electrode of the storage capacitor is in the first conductive layer, and
    wherein the second electrode of the storage capacitor is in the second conductive layer.

4. The display device of claim 2, wherein the non-display area further comprises a data transmission line connected to the data input electrode and located in the first conductive layer.

5. The display device of claim 2, wherein the first electrode of the pixel transistor, the data input electrode and the data output electrode of the demultiplexer transistor are located in a third conductive layer on the second conductive layer.

6. The display device of claim 5, wherein the scan transmission line and the data line are located in a fourth conductive layer on the third conductive layer.

7. The display device of claim 5, wherein the data line is located in a fourth conductive layer on the third conductive layer, the scan transmission line is located in a fifth conductive layer on the fourth conductive layer.

8. The display device of claim 5, wherein the non-display area further comprises a scan connection electrode connecting the scan line and the scan transmission line, the scan connection electrode and the data line are located in a fourth conductive layer on the third conductive layer, the scan transmission line is located in a fifth conductive layer on the fourth conductive layer.

9. The display device of claim 1, wherein the display area comprises:

a first side;

a second side intersecting with the first side; and a corner portion where the first side and the second side meet and which has an interior angle larger than 90°.

10. The display device of claim 9, wherein the corner portion of the display area has a rounded curved shape, and the demultiplexing circuit unit includes a rounded curved shape corresponding to the corner portion.

11. The display device of claim 9, further comprising:

a scan driver adjacent to the first side and connected to the scan transmission line.

12. The display device of claim 11, wherein the demultiplexing circuit unit is adjacent to the second side and the corner portion.

13. A display device, comprising:

a display area including a plurality of pixel circuits, each having a pixel transistor of a plurality of pixel transistors, a plurality of scan lines connected to the pixel transistors, and a plurality of data lines connected to the pixel transistors; and a non-display area adjacent to the display area, the non-display area including a demultiplexing circuit unit and a scan transmission line connected to a scan line of the plurality of scan lines and overlapping with the demultiplexing circuit unit, wherein the demultiplexing circuit unit comprises:

a data input electrode;

a first demultiplexer gate electrode located at one side of the data input electrode;

a first data output electrode located at one side of the first demultiplexer gate electrode and connected to a first data line of the plurality of data lines;

a second demultiplexer gate electrode located at another side of the data input electrode; and a second data output electrode located at one side of the second demultiplexer gate electrode and connected to a second data line of the plurality of data lines, and wherein the scan transmission line is located in a different conductive layer from the data input electrode, the first and second demultiplexer gate electrodes, and the first and second data output electrodes.

14. The display device of claim 13, wherein the non-display area further comprises a demultiplexer selection line connected to the first demultiplexer gate electrode or the second demultiplexer gate electrode, wherein a gate electrode of the pixel transistor and the first and second demultiplexer gate electrodes are located in a first conductive layer, and wherein the demultiplexer selection line is in a second conductive layer on the first conductive layer.

15. The display device of claim 14, wherein each of the plurality of pixel circuits further comprises a storage capacitor comprising a first electrode and a second electrode, wherein the first electrode of the storage capacitor is in the first conductive layer, and wherein the second electrode of the storage capacitor is in the second conductive layer.

16. The display device of claim 14, wherein the non-display area further comprises a data transmission line connected to the data input electrode and located in the first conductive layer.

17. The display device of claim 14, wherein a first electrode of the pixel transistor, the data input electrode, and the first and second data output electrodes are located in a third conductive layer on the second conductive layer.

18. The display device of claim 17, wherein the scan transmission line, and the first and second data lines are located in a fourth conductive layer on the third conductive layer.

19. The display device of claim 17, wherein the first and second data lines are located in a fourth conductive layer on the third conductive layer, the scan transmission line is located in a fifth conductive layer on the fourth conductive layer.

20. The display device of claim 17, wherein the non-display area further comprises a scan connection electrode connecting the scan line and the scan transmission line, the scan connection electrode and the first and second data lines are located in a fourth conductive layer on the third conductive layer, and the scan transmission line is located in a fifth conductive layer on the fourth conductive layer.

* * * * *